(12) United States Patent
Garlepp et al.

(10) Patent No.: US 7,193,467 B2
(45) Date of Patent: Mar. 20, 2007

(54) DIFFERENTIAL AMPLIFIERS AND METHODS OF USING SAME

(75) Inventors: Bruno W. Garlepp, San Jose, CA (US); Andrew C. C. Ho, Palo Alto, CA (US)

(73) Assignee: Rambus Inc., Los Altos, CA (US)

( * ) Notice: Subject to any disclaimer, the term of this patent is extended or adjusted under 35 U.S.C. 154(b) by 85 days.

(21) Appl. No.: 10/811,922

(22) Filed: Mar. 30, 2004

(65) Prior Publication Data
US 2005/0218986 A1    Oct. 6, 2005

(51) Int. Cl.
  *H03F 3/45*  (2006.01)
(52) U.S. Cl. ..................... 330/259; 330/253
(58) Field of Classification Search ............. None
  See application file for complete search history.

(56) References Cited
U.S. PATENT DOCUMENTS 5,838,199 A * 11/1998 Nakamura ............ 330/258
6,759,904 B2 * 7/2004 Behzad ................ 330/254
6,795,843 B1 * 9/2004 Groe .................... 708/801

OTHER PUBLICATIONS

Aaron Martin et al., 8Gb/s Differential simultaneous bidirectional link with 4Mv 9ps waveform capture diagnostic capability, ISSCC 2003, Session 4, Clock Recovery and Backplane Transceivers, Paper 4.5, 10 pages.
U.S. Appl. No. 10/673,677, filed Sep. 30, 2003 entitled "Technical For Receiving Differential Multi-PAM Signals".

* cited by examiner

*Primary Examiner*—Khanh Van Nguyen
(74) *Attorney, Agent, or Firm*—Hunton & Williams

(57) ABSTRACT

A differential amplifier and method of using same are disclosed. In one particular exemplary embodiment, the present invention may be realized as a circuit comprising a differential amplifier for receiving a differential input signal and generating a differential output signal, a comparator for generating an adjustment signal based at least in part upon the differential output signal, and a current controller for controlling current steering and at least one offset current in the differential amplifier based at least in part upon the adjustment signal and a current steering variable signal.

22 Claims, 10 Drawing Sheets

DIFFERENTIAL AMPLIFIERS AND METHODS OF USING SAME

FIELD OF THE INVENTION

The present invention relates generally to differential signal conditioning and, more particularly, to differential amplifiers and methods of using same.

BACKGROUND OF THE INVENTION

The desired speed (i.e., bit rate) of broadband serial data communication systems is constantly increasing. Although semiconductor process improvements are enabling the design of processing circuitry that supports these higher speeds, challenging problems are emerging related to the reliable capture of data at the receiver side of these communication systems. For example, due to the decreasing geometries of semiconductor processes, the available voltage for signaling and for supplying analog circuits is decreasing. This is degrading the signaling signal-to-noise (S/N) ratio while complicating the design of high-speed receiver circuits due to limited voltage headroom. Also, because physical transmission paths in many of these communications systems are not being significantly improved, received signals are suffering more and more from parasitic dispersive and reflective effects of the transmission paths. Addressing this often requires adaptive equalization which increases the need for precision control over the gain, range, offset, and linearity of the high-speed receiver circuits. Furthermore, the use of multiple level pulse amplitude modulation (multi-PAM) signaling is becoming more common to reduce the signaling problems mentioned above. However, the smaller voltage levels used in multi-PAM systems also drives the need for precision control over the gain, range, offset, and linearity of the high-speed receiver circuits.

Several topologies have been used for receiver circuits to enable the reception of high-speed, small-amplitude, multi-PAM signals. For example, controllable input offset voltage has sometimes been enabled within samplers of the high-speed receiver circuits to enable sampling at the centers of least significant bit (LSB) eyes. Also, preamplifiers have sometimes been used in front of the samplers. However, these and other circuit techniques suffer from some or all of the following problems: 1.) gain compression leading to reduced S/N ratio; 2.) sampler kickback affecting the sampling resolution, and therefore the effective S/N ratio; 3.) non-linear input offset voltage control as a function of input signal common mode level; 4.) lack of control over systematic integral non-linearity (INL) of the input offset voltage control transfer function; 5.) de-coupling of offset between preamplifiers and samplers which complicates offset cancellation and sampler swapping; and 6.) non-linear input offset voltage control transfer functions.

To demonstrate some of the above-mentioned problems, assume a high-speed communication system that supports differential signaling. Differential signaling typically requires differential receiver circuits having differential amplifier circuitry. Also, it is desirable to implement differential amplifier circuitry with a controllable input offset voltage. Such differential amplifier circuitry requires a differential voltage applied at its inputs equal and opposite to the input offset voltage to produce a zero differential voltage at its outputs. As used herein the term "twist voltage" refers to the differential input voltage required at the input of a differential amplifier in order to obtain a zero (or substantially zero) differential output voltage. It is desirable to implement differential amplifier circuitry where the value of the twist voltage is controllable, preferably through a substantially linear transfer function. An example application for such differential amplifier circuitry is in a differential 4-level pulse amplitude modulation (4-PAM) signal receiver, where differential amplifiers, with controllable input offset voltage, could serve as preamplifiers for feeding LSB samplers. This enables samplers with zero differential voltage thresholds to be effectively used for sampling at the centers of LSB eyes. By adjusting the twist voltage of the pre-amplifiers, the effective sampling level could be adjusted depending on the magnitude of the 4-PAM signal present at the receiver, since this magnitude affects the centers of the LSB eyes.

Before describing the details of a differential amplifier with substantially linear twist voltage control for use with differential 4-PAM signals, it is useful to first describe the details of 4-PAM signaling. Thus, referring to FIG. 1, signal waveforms for a single-ended 4-PAM signaling system are shown, along with reference levels (i.e., $V_{refH}$, $V_{refM}$, and $V_{refL}$), logic signal levels (i.e., in Gray code sequence 0, 1, 3, and 2), and logic signal level binary values (i.e., in Gray code sequence 00, 01, 11, and 10). The reference levels are used to determine most significant bits (MSBs) and least significant bits (LSBs) of signals in terms of the logic signal level binary values. That is, the MSB of a signal may be extracted by a simple comparison of the signal to the $V_{refM}$ reference level. In contrast, the LSB of a signal must be extracted through a simultaneous comparison of the signal to both the $V_{refH}$ and $V_{refL}$ reference levels.

Single-ended multi-level signaling systems, such as the single-ended 4-PAM signaling system discussed above, are often implemented to alleviate signal attenuation problems which are frequently encountered in high-speed (e.g., above 5 Gb/s) serial link channels, which are often found in backplane environments. However, despite the benefits obtained through the use of single-ended multi-level signaling systems, further solutions may also be required to address such signal attenuation problems. One such solution is realized through the use of differential multi-level signaling systems due primarily to the benefits that differential signaling offers in the area of common-mode noise rejection.

Referring to FIG. 2, a differential signal waveform (i.e., Vin(diff)=Vin(+)−Vin(−)) for a differential 4-PAM signaling system is shown, along with reference twist voltage levels (i.e., $V_{refH}$, $V_{refM}$, and $V_{refL}$), differential logic signal level binary values (i.e., in Gray code sequence 00, 01, 11, and 10), Vin(diff) logic signal levels (i.e., in Gray code sequence 0, 1, 3, and 2), and Vin(diff) MSB & LSB logic value ranges. Analogous to the case for the single-ended 4-PAM signaling system described above, the reference levels are used to determine MSBs and LSBs of the differential signal in terms of the differential logic signal level binary values. That is, the MSB of the differential signal may be extracted by a simple differential comparison of the differential signal to the $V_{refM}$ reference level. In contrast, the LSB of the differential signal must be extracted through a simultaneous comparison of the differential signal to both the $V_{refH}$ and $V_{refL}$ reference levels.

With the details of 4-PAM signaling having been described, the details of a differential amplifier with substantially linear twist voltage control for use with differential 4-PAM signals may now be described. Thus, one way to implement a differential amplifier with substantially linear twist voltage control for use with differential 4-PAM signals is to use two oppositely skewed differential pairs to drive a shared differential load. For example, referring to FIG. 3, there is shown a differential amplifier 100 comprising a first differential transistor pair 102, a second differential transistor pair 104, a first current source 106, a second current source 108, a first load 110 (i.e., resistance R), and a second load 112 (i.e., resistance R), wherein M represents a normalized size of the transistors in the first 102 and second 104 differential transistor pairs, N represents a transistor size ratio variable, and α represents a current steering variable. By steering a fixed amount of tail current, $I_t$, from the first differential transistor pair 102 to the second differential transistor pair 104, or vice versa, the effective twist voltage can be adjusted from $+\text{Vtwist}_{max}$ to $-\text{Vtwist}_{max}$, where $\text{Vtwist}_{max}$ is the systematic offset voltage of each of the first differential transistor pair 102 and the second differential transistor pair 104, as shown in FIG. 4, wherein Vin(diff) represents the differential signal formed of input signals Vin(+) and Vin(−) and Vout(diff) represents the differential signal formed of output signals Vout(+) and Vout(−). This systematic offset voltage is due to the difference in size between the two transistors in each of the first differential transistor pair 102 and the second differential transistor pair 104. The magnitude of the systematic offset voltage for each differential transistor pair is approximately proportional to the square root of its tail current, $I_t$, and the square root of its transistor size ratio.

If all of the components in the differential amplifier 100 match perfectly, the resulting current steering to twist voltage transfer function will look similar to the solid curve shown in FIG. 5. Note that although the solid curve shown in FIG. 5 is symmetrical about the origin, it is slightly non-linear. At any value of current steering (α), the integral non-linearity (INL) of the transfer function is the difference between the solid curve and the dotted, perfectly linear curve.

The INL shown in FIG. 5 is moderate in magnitude and is systemic. Therefore, many applications would find this INL to be either acceptable as is or easy to compensate for using any of several circuit techniques. However, device mismatches in actual circuit implementations may both randomly shift and randomly rotate the transfer function curve of FIG. 5, effectively changing and unbalancing both the y-axis crossing point (nominal twist voltage) and the y-axis endpoints (twist voltage range) of the transfer function curve, such as shown in FIG. 6. Both of these effects can not only worsen the absolute INL of each amplifier, but they can also severely worsen the relative INL's between amplifiers. They can further cause the twist voltage range to either be too small or too big. These issues may be unacceptable, particularly in circuits where matching twist voltages between two or more amplifiers is important.

In view of the foregoing, it would be desirable to provide a technique for reducing the effects of random mismatches in circuit components of differential amplifiers which overcomes the above-described inadequacies and shortcomings.

SUMMARY OF THE INVENTION

According to the present invention, differential amplifiers and methods of using same are provided. In one particular exemplary embodiment, the present invention may be realized as a circuit comprising a differential amplifier for receiving a differential input signal and generating a differential output signal, a comparator for generating an adjustment signal based at least in part upon the differential output signal, and a current controller for controlling current steering and at least one offset current in the differential amplifier based at least in part upon the adjustment signal and a current steering variable signal.

In accordance with other aspects of this particular exemplary embodiment of the present invention, the differential amplifier may beneficially comprise a first differential transistor pair and a second differential transistor pair, wherein the current controller steers current to one or both of the first and second differential transistor pairs. If such is the case, the current controller may beneficially control an amount of offset current in the first differential transistor pair and/or the second differential transistor pair.

In accordance with further aspects of this particular exemplary embodiment of the present invention, the differential output signal may beneficially comprise complementary positive and negative output signal components, wherein the comparator compares the difference between the positive and negative output signal components.

In accordance with additional aspects of this particular exemplary embodiment of the present invention, the differential input signal may beneficially be a differential multi-PAM input signal.

In accordance with still other aspects of this particular exemplary embodiment of the present invention, the circuit may further beneficially comprise a differential input multiplexer for selecting between a differential input voltage signal and at least one differential reference signal for the differential input signal. If such is the case, the at least one differential reference signal may beneficially comprise a differential zero voltage reference signal and/or a differential twist voltage reference signal. Also, the current controller may also beneficially receive a select signal for enabling the current controller when the differential input multiplexer selects either the differential twist voltage reference signal or the differential zero voltage reference signal for the differential input signal. Further, control of the at least one offset current may beneficially be disabled when the differential input multiplexer selects the differential input voltage signal for the differential input signal. Likewise, control of a tail current component of the differential amplifier may beneficially be disabled when the differential input multiplexer selects the differential input voltage signal for the differential input signal. In this case, the differential input voltage signal may also beneficially be a differential multi-PAM input voltage signal.

In another particular exemplary embodiment, the present invention may be realized as a method for reducing the effect of random mismatches in circuit components in a differential amplifier comprising applying a differential zero voltage reference signal to an input of the differential amplifier, adjusting at least one offset current component of the differential amplifier until a differential output voltage from an output of the differential amplifier is equal to zero, applying a differential twist voltage reference signal to the input of the differential amplifier, and adjusting tail current components of the differential amplifier until a differential output voltage from an output of the differential amplifier is equal to zero.

In accordance with other aspects of this particular exemplary embodiment of the present invention, the method may further beneficially comprise setting the value of a current steering variable signal to zero before adjusting the at least one offset current component of the differential amplifier.

In accordance with further aspects of this particular exemplary embodiment of the present invention, the method may further beneficially comprise setting the value of a current steering variable signal to a predetermined value before adjusting tail current components of the differential amplifier.

In accordance with additional aspects of this particular exemplary embodiment of the present invention, the method may further beneficially comprise repeating at least some of the applying and adjusting steps recited above until the adjustments to the at least one offset current component and the tail current components are not significant. If such is the case, the method may further beneficially comprise applying a differential input voltage signal to the input of the differential amplifier, and adjusting current steering in the differential amplifier until a desired twist voltage is achieved. In this case, the differential input voltage signal may beneficially be a differential multi-PAM input voltage signal.

In still another particular exemplary embodiment, the present invention may be realized as at least one signal embodied in at least one carrier wave for transmitting a computer program of instructions configured to be readable by at least one processor for instructing the at least one processor to execute a computer process for performing the method as recited above.

In yet another particular exemplary embodiment, the present invention may be realized as at least one processor readable carrier for storing a computer program of instructions configured to be readable by at least one processor for instructing the at least one processor to execute a computer process for performing the method as recited above.

In still yet another particular exemplary embodiment, the present invention may be realized as a differential amplifier comprising means for applying a differential zero voltage reference signal to an input of the differential amplifier, means for adjusting at least one offset current component of the differential amplifier until a differential output voltage from an output of the differential amplifier is equal to zero, means for applying a differential twist voltage reference signal to the input of the differential amplifier, and means for adjusting tail current components of the differential amplifier until a differential output voltage from an output of the differential amplifier is equal to zero.

The present invention will now be described in more detail with reference to exemplary embodiments thereof as shown in the accompanying drawings. While the present invention is described below with reference to exemplary embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the accompanying drawings, in which like elements are referenced with like numerals. These drawings should not be construed as limiting the present invention, but are intended to be exemplary only.

DETAILED DESCRIPTION OF EXEMPLARY EMBODIMENT(S)

Figure 7:
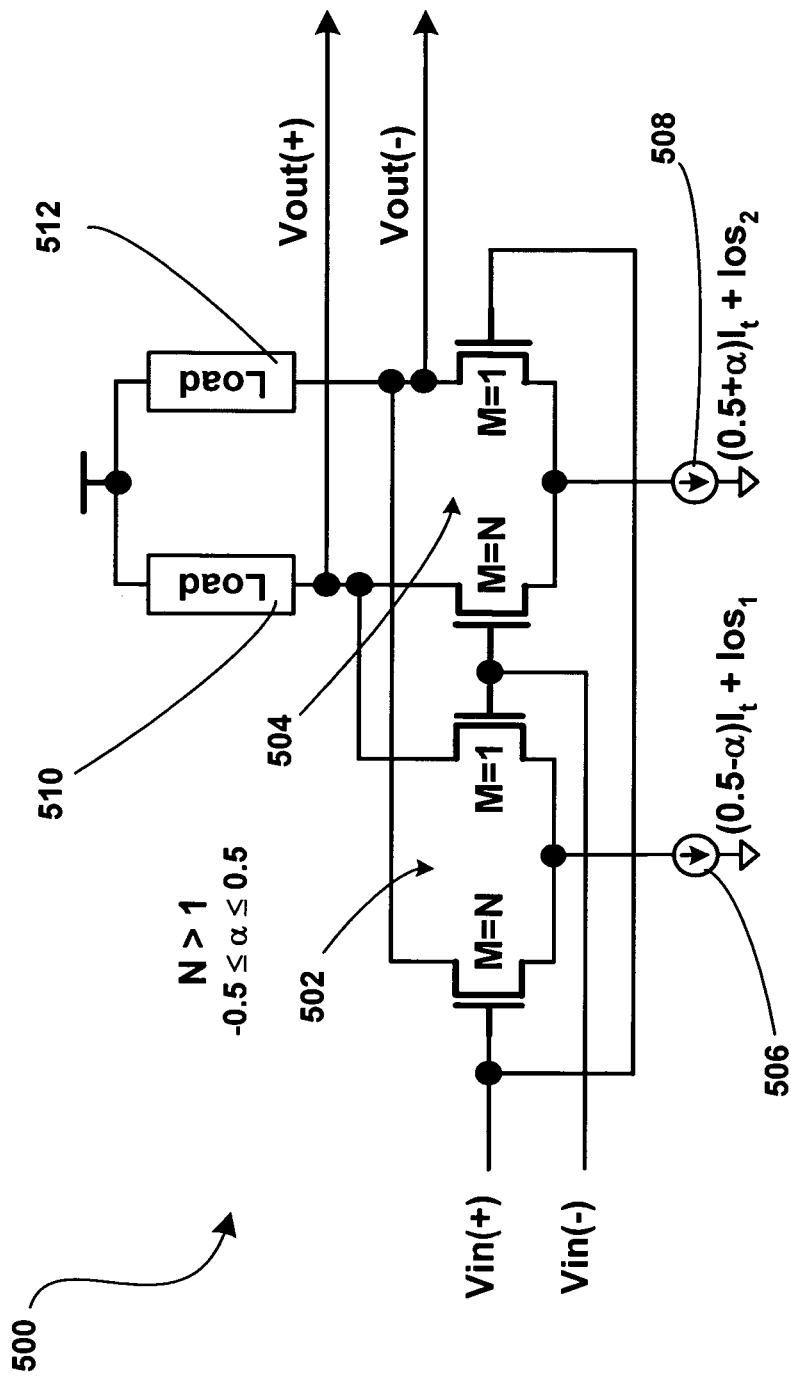
FIG. 7 shows a functional block diagram of a differential amplifier in accordance with an embodiment of the present invention.

Referring to FIG. 7, there is shown a functional block diagram of a twistable differential amplifier 500 in accordance with an embodiment of the present invention. As used herein the term "twistable differential amplifier" refers to a differential amplifier having controllable input offset voltage, and the term "twist voltage" refers to the differential input voltage required at the input of a differential amplifier in order to obtain a zero differential output voltage. The twistable differential amplifier 500 comprises a first differential transistor pair 502, a second differential transistor pair 504, a first current source 506, a second current source 508, a first load 510, and a second load 512, wherein M represents a normalized size of the transistors in the first 502 and second 504 differential transistor pairs, N represents a transistor size ratio variable, and α represents a current steering variable.

Figure 1:
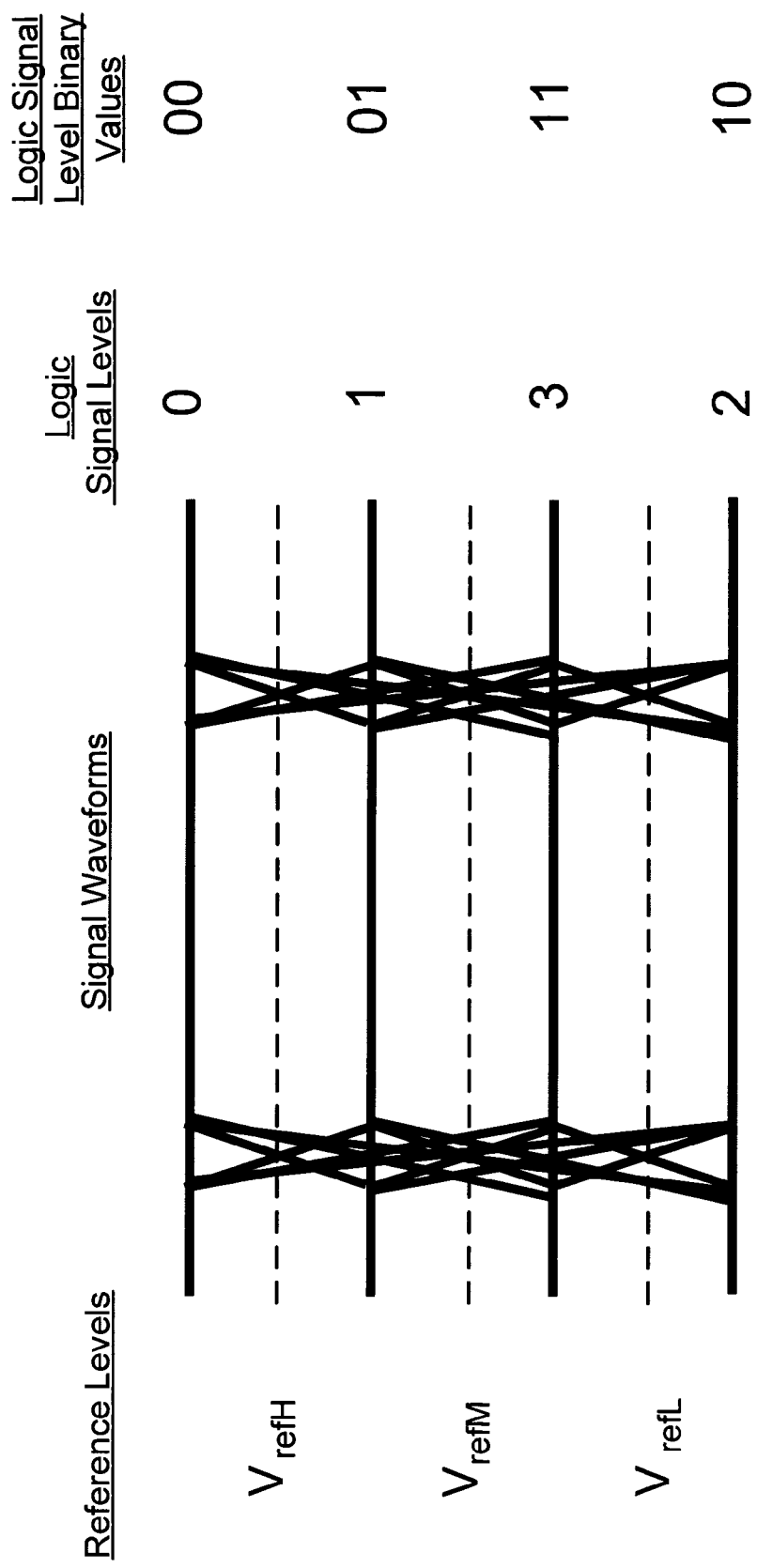
FIG. 1 shows signal waveforms for a single-ended 4-PAM signaling system.
Figure 2:
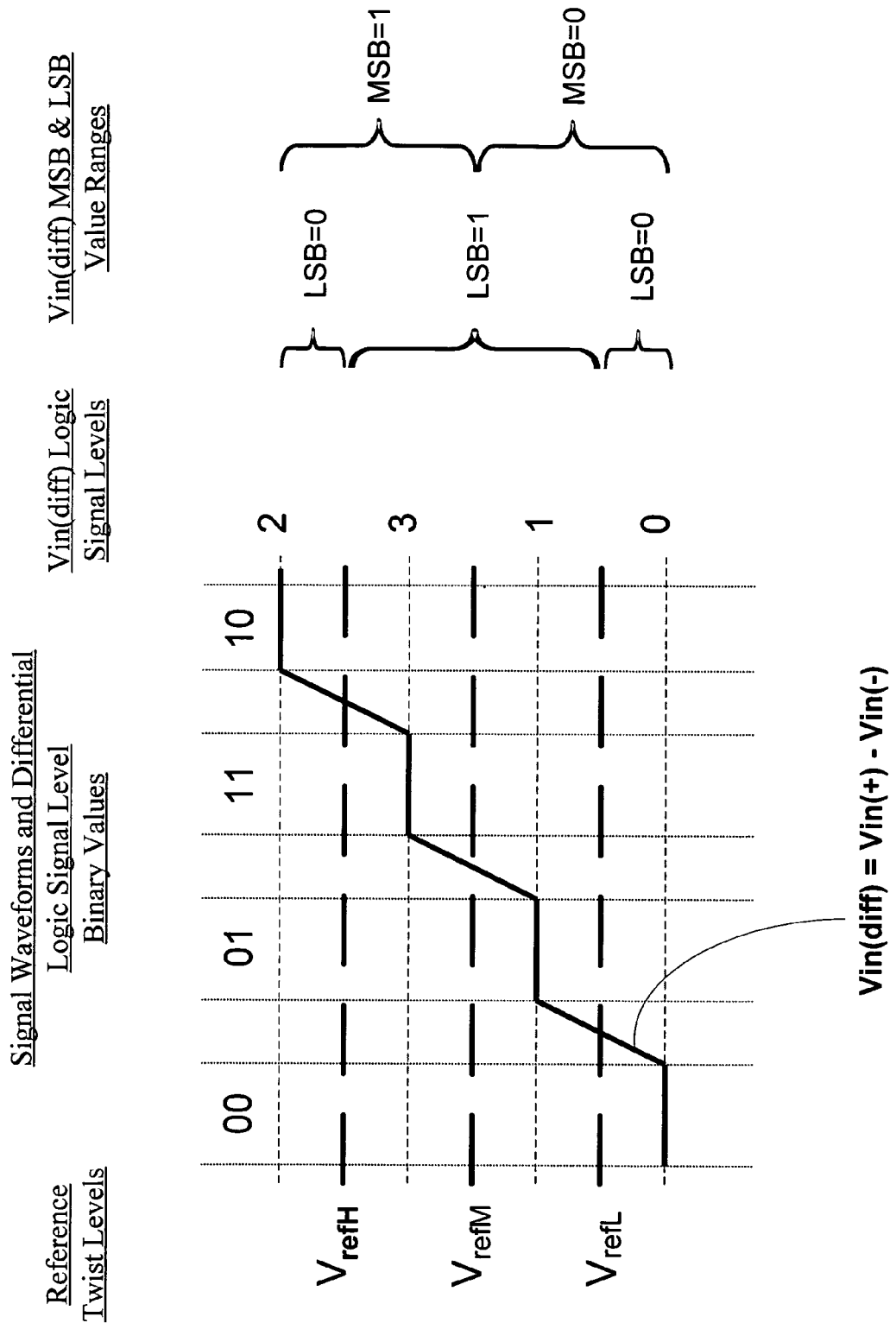
FIG. 2 shows a differential signal waveform for a differential 4-PAM signaling system.
Figure 3:
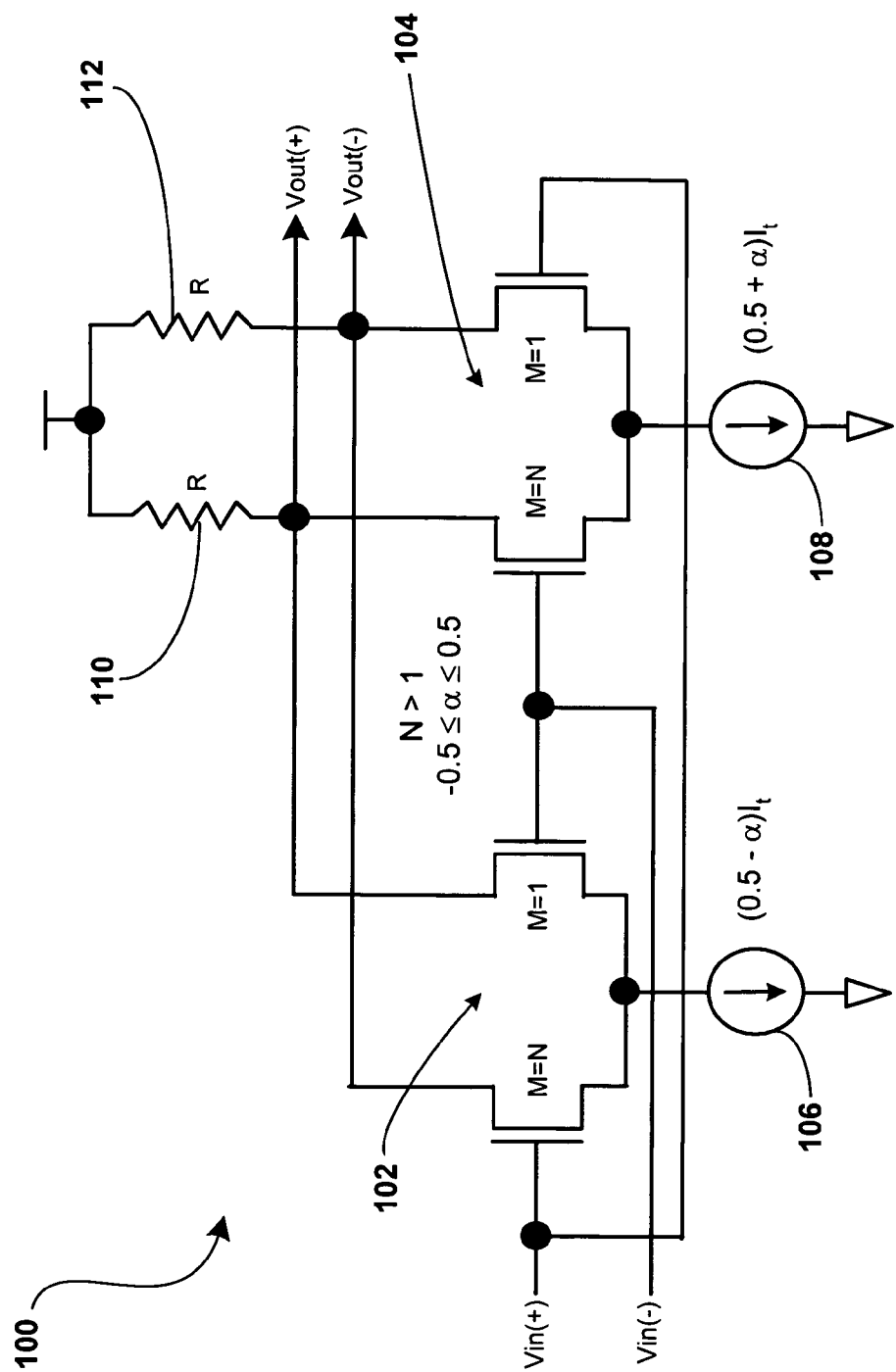
FIG. 3 shows a prior art differential amplifier.
Figure 4:
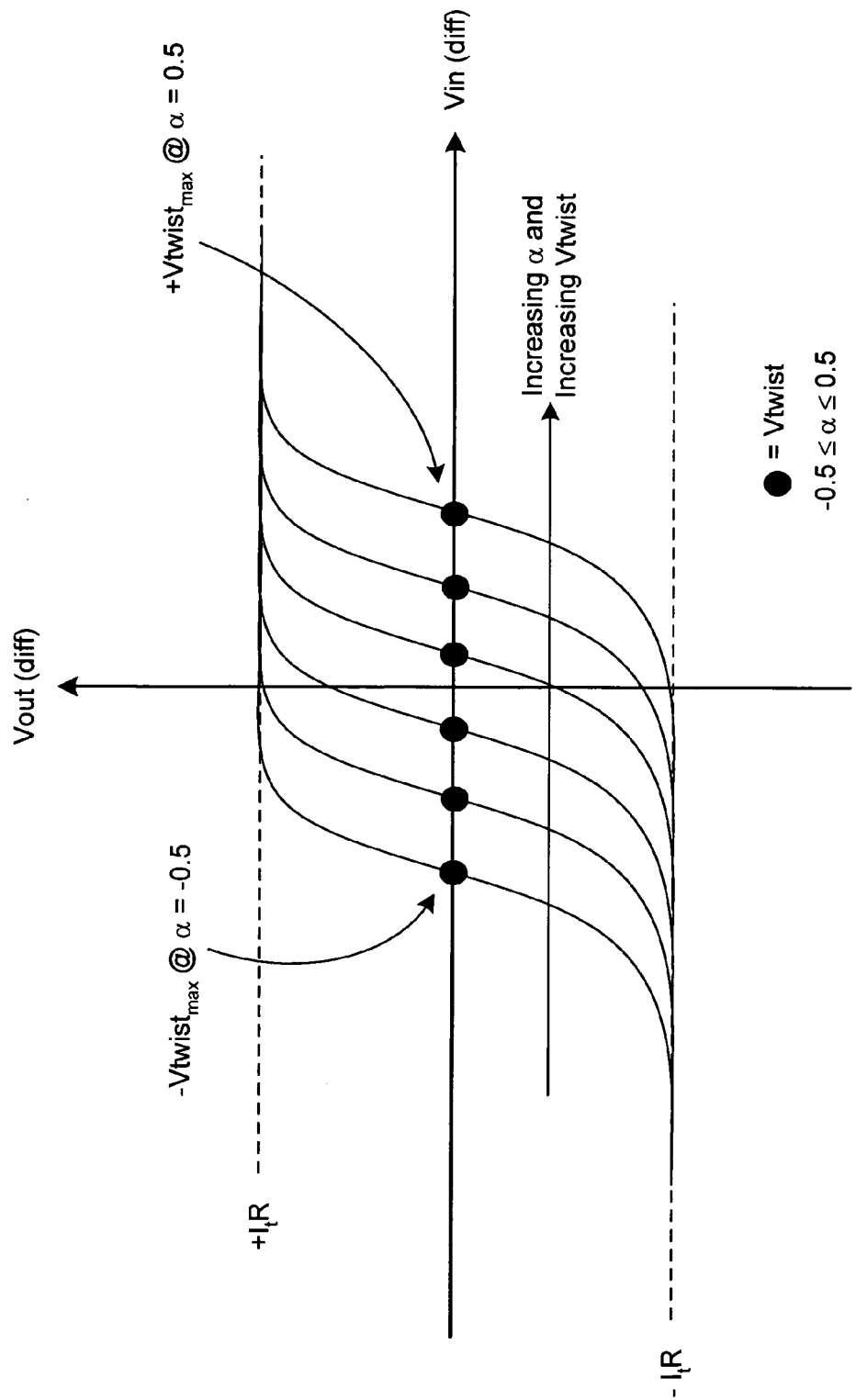
FIG. 4 shows the differential input voltage to differential output voltage transfer function curves of the prior art differential amplifier of FIG. 3 for varying degrees of current steering.

The twistable differential amplifier 500 of FIG. 7 differs from the prior art differential amplifier 100 of FIG. 3 in that the first current source 506 and the second current source 508 each include an additional offset current component ($I_{os}$) along with an adjustable steerable tail current component ($I_t$). The additional offset current component ($I_{os1}$) in the first current source 506 causes the systematic offset voltage of first differential transistor pair 502 to shift. Likewise, the additional offset current component ($I_{os2}$) in the second current source 508 causes the systematic offset voltage of second differential transistor pair 504 to shift. In both cases, larger $I_{os}$ causes larger systematic offset in the associated differential transistor pair. By increasing $I_{os1}$ relative to $I_{os2}$ or decreasing $I_{os1}$ relative to $I_{os2}$, the systematic offset voltages in each of the first differential transistor pair 502 and the second differential transistor pair 504 are changed such that the current steering to twist voltage transfer function curve shifts along the y-axis.

Increasing (decreasing) the absolute value of the adjustable steerable tail current component ($I_t$) has the effect of simultaneously increasing (decreasing) the values of the systematic offset voltages in the first differential transistor pair 502 and the second differential transistor pair 504. These correlated changes in the values of the systematic offset voltages in the first differential transistor pair 502 and the second differential transistor pair 504 has the effect of rotating the current steering to twist voltage transfer function curve (i.e., both end points of the current steering to twist voltage transfer function curve move either away or toward the x-axis at $\alpha=+/-0.5$).

Figure 5:
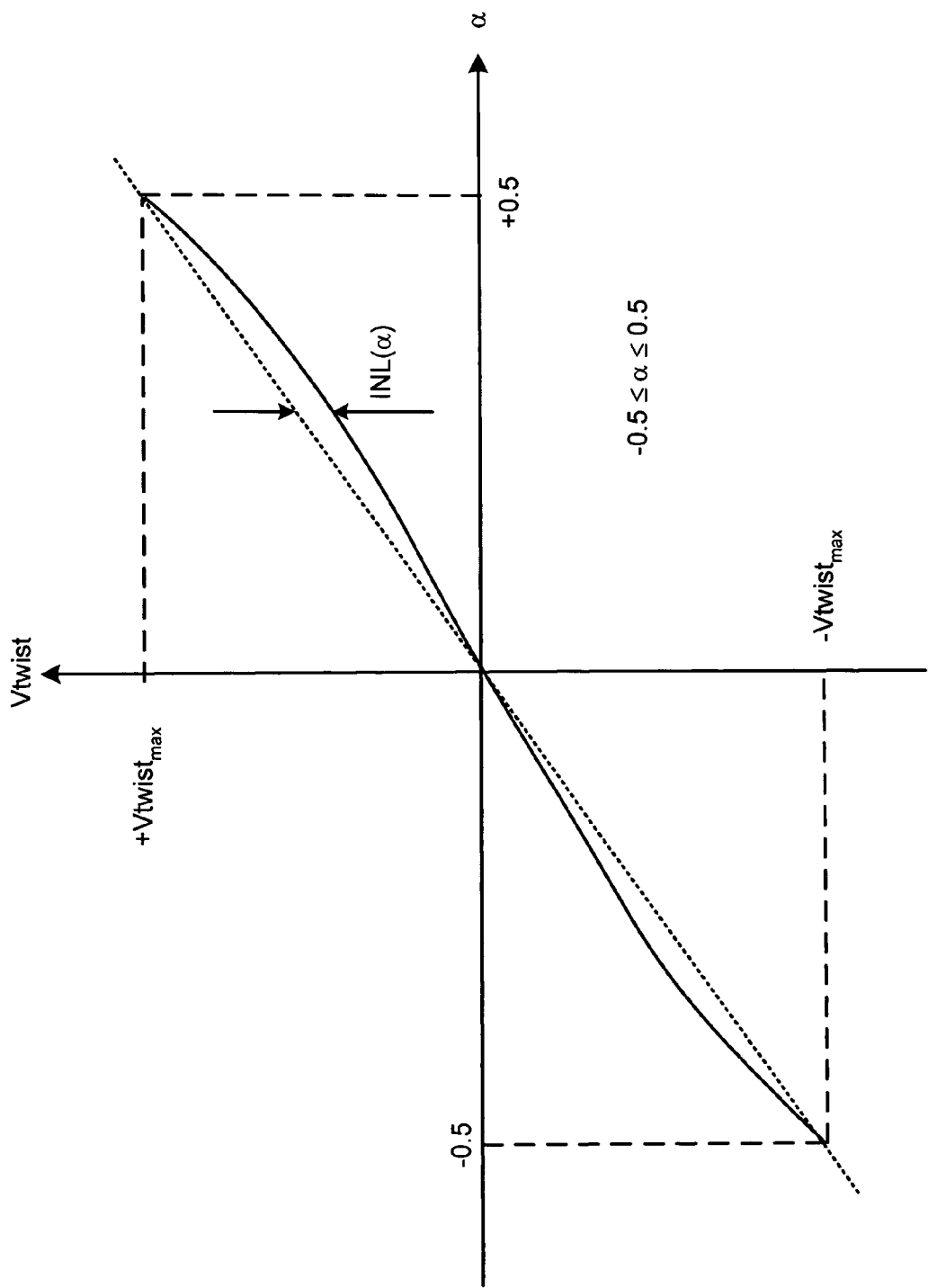
FIG. 5 shows a current steering to twist voltage transfer function curve for the prior art differential amplifier of FIG. 3 with no mismatched components.
Figure 6:
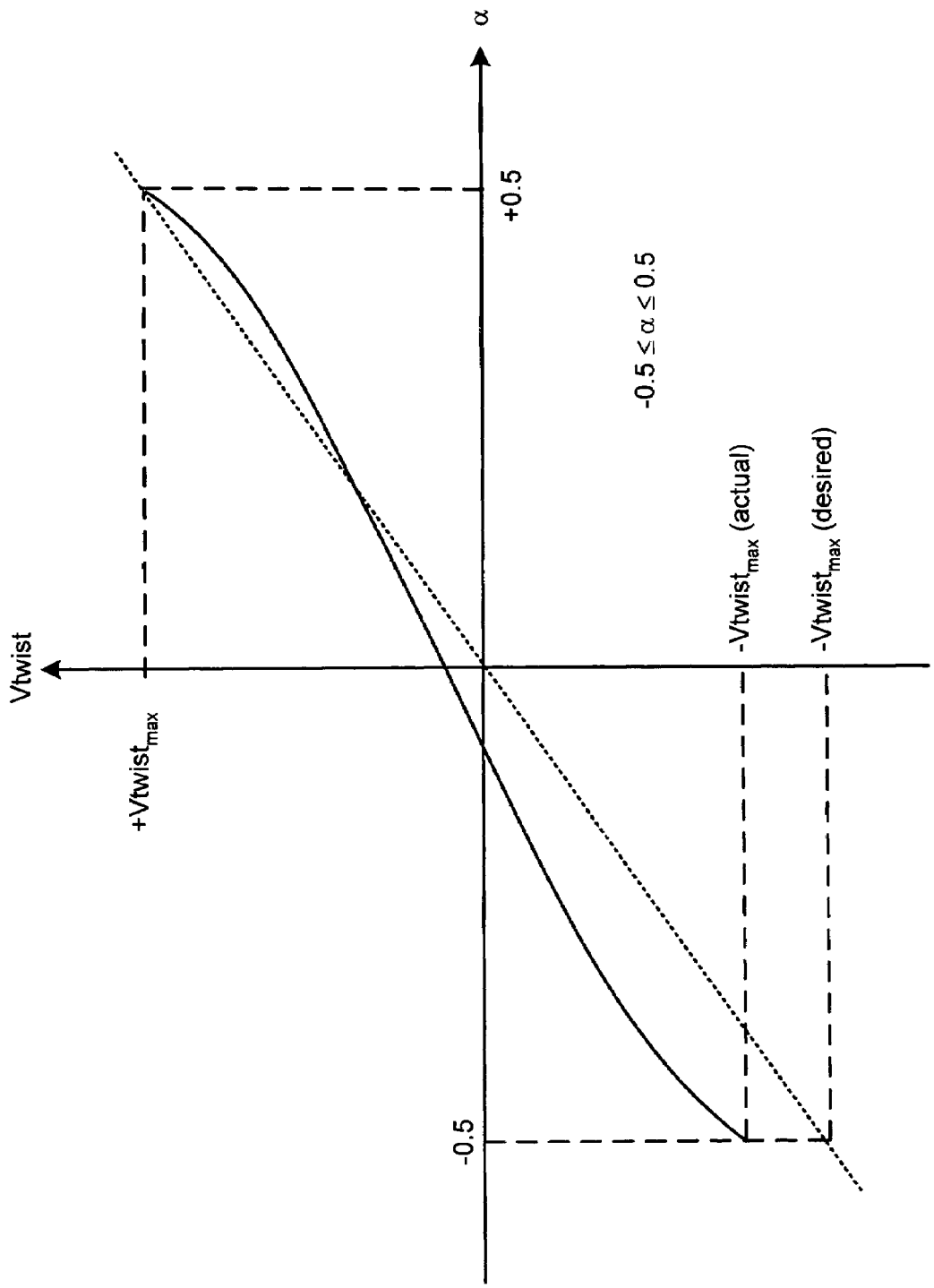
FIG. 6 shows a current steering to twist voltage transfer function curve for the prior art differential amplifier of FIG. 3 with mismatched components.

The above-described effects associated with the additional offset current component ($I_{os}$) and the adjustable tail current component ($I_t$) in each of the first current source 506 and the second current source 508 allow for the removal of the effects of random mismatches in circuit components in prior art differential amplifiers as described above with respect to FIGS. 1–6. That is, the above-described effects associated with the additional offset current component ($I_{os}$) and the adjustable steerable tail current component ($I_t$) in each of the first current source 506 and the second current source 508 enables the correction of shifted and rotated current steering to twist voltage transfer function curves such as shown in FIG. 6 substantially back to a more ideal current steering to twist voltage transfer function curve that suffers substantially only from systematic INL such as shown in FIG. 5.

Figure 8:
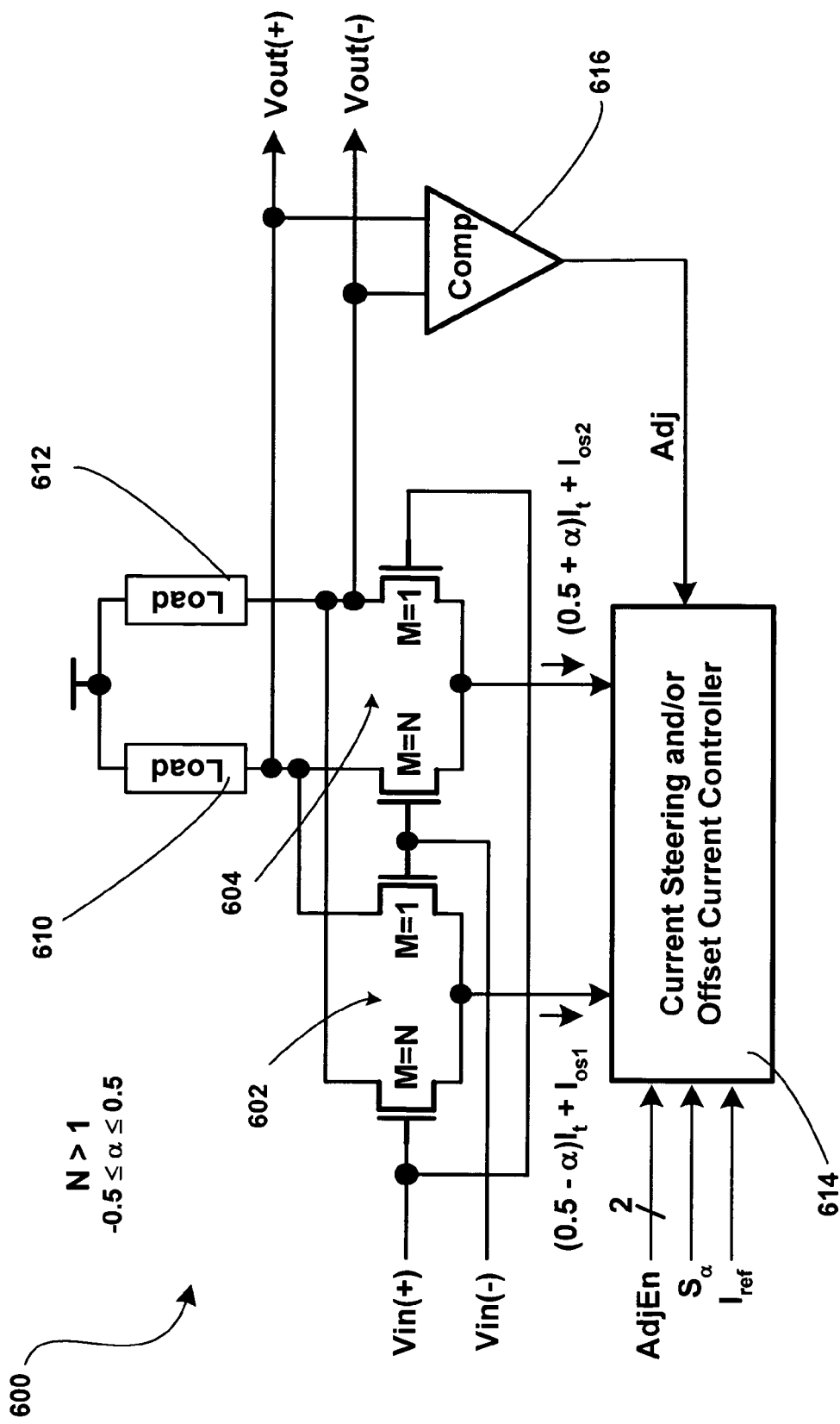
FIG. 8 shows a detailed block diagram of a differential amplifier in accordance with an embodiment of the present invention.

Referring to FIG. 8, there is shown a detailed block diagram of a twistable differential amplifier 600 in accordance with an embodiment of the present invention. The twistable differential amplifier 600 comprises a first differential transistor pair 602, a second differential transistor pair 604, a first load 610, and a second load 612, a current steering and/or offset current controller 614, and a differential comparator 616, wherein M represents a normalized size of the transistors in the first 602 and second 604 differential transistor pairs, N represents a transistor size ratio variable, and $\alpha$ represents a current steering variable.

As shown in FIG. 8, the differential comparator 616 monitors the differential output voltage (Vout) from the twistable differential amplifier 600 and generates an adjustment signal (Adj) that is used by the current steering and/or offset current controller 614 to control the absolute value of the tail current component ($I_t$) and the value of the offset current components ($I_{os}$). Also, the current steering and/or offset current controller 614 receives a current steering variable signal ($S_\alpha$) for controlling the proportion of tail current ($I_t$) that is steered to the first differential transistor pair 602 and to the second differential transistor pair 604. Further, the current steering and/or offset current controller 614 receives a current reference signal ($I_{ref}$) to generate a tail current reference signal ($I_{tref}$, see FIG. 10) and an offset current reference signal ($I_{osref}$, see FIG. 10) within the current steering and/or offset current controller 614 to control the absolute value of the tail current component ($I_t$) and the value of the offset current components ($I_{os}$). Additionally, the current steering and/or offset current controller 614 receives an adjustment enable signal (AdjEn) for controlling the state of the current steering and/or offset current controller 614. That is, the state of the adjustment enable signal (AdjEn) determines whether the current steering and/or offset current controller 614 is enabled for adjustment of the tail current component ($I_t$) or the offset current components ($I_{os}$), or whether the current steering and/or offset current controller 614 is enabled for normal operation. Of course, during normal operation, the current steering and/or offset current controller 614 may still control the proportion of tail current ($I_t$) that is steered to the first differential transistor pair 602 and to the second differential transistor pair 604 based upon the value of the current steering variable signal ($S_\alpha$).

At this point it should be noted that the differential comparator 616 may be implemented in various forms. For example, the differential comparator 616 could be a continuous time device such as an amplifier and comparator circuit. Alternatively, the differential comparator 616 could be a sampled (discrete time) device such as an input receiver, clocked comparator, sampler, or sample-and-hold circuit. Also, the differential comparator 616 may be disconnected or disabled when not adjusting the tail current component ($I_t$) or the offset current components ($I_{os}$). Alternatively, the adjustment signal (Adj) generated by the differential comparator 616 could be used as a received data signal, as would typically be the case in a 4-PAM receiver.

The twistable differential amplifier 600 of FIG. 8 may provide multiple benefits over the prior art differential amplifier 100 of FIG. 3, as well as other prior art differential amplifiers, particularly when used as a preamplifier with a corresponding LSB sampler in differential multi-PAM signal receivers. For example, unlike prior art non-twistable differential amplifiers, the twistable differential amplifier 600 does not produce gain compression. Regardless of the current steering setting (i.e., value of $S_\alpha$), the switching point of the output of the twistable differential amplifier 600 always occurs at the most linear portion of the Vout/Vin transfer curve of FIG. 2 (i.e., when Vout(+)=Vout(−)). Additionally, the switching point of an associated sampler would occur when there is equal current flow through both sides of its differential circuitry (i.e., at its most linear operating point). Thus, there is also no twist voltage-dependant non-linearity contributed by the LSB samplers since they need not have controllable input offset voltage as in some prior art 4-PAM LSB receivers. This is in contrast to the case where a prior art non-twistable differential amplifier precedes a twistable LSB sampler. Both the prior art non-twistable differential amplifier and the twistable LSB sampler would produce undesirable gain non-linearity as a function of twist voltage (e.g., gain compression).

The twistable differential amplifier 600 would also provide isolation between all samplers in a differential multi-PAM signal receiver, thereby removing any concerns of kickback between samplers. Self-kickback is fully differential and therefore does not lead to hysteresis or anti-hysteresis. Furthermore, the effective twist voltage in the twistable differential amplifier 600 is highly insensitive to the input common mode. This simplifies the design of the twist voltage circuitry. It also enables receiver operation in the presence of common mode fluctuations, either random or systematic (e.g., common mode signaling in addition to high-speed differential signaling). Significantly, the twistable differential amplifier 600 provides precise control of twist voltage range and precise nulling of random INL. Additionally, the combined offsets of both the twistable differential amplifier 600 and an associated LSB sampler may be calibrated out simultaneously without any significant dependence on the twist voltage setting when the associated LSB sampler is used as the differential comparator 616 of FIG. 8. Simultaneously calibrating out the offset of both the twistable differential amplifier 600 and an associated LSB sampler not only makes their operation more precise, but it also allows the swapping of preamplifier/sampler pairs without significant changes in effective sampling level due to residual offsets. Furthermore, the twistable differential amplifier 600 can provide a natural high-pass response which can help in equalizing overall channel response without lowering transmit power level, as is the case for pre-emphasis equalization.

In operation in a differential multi-PAM signal receiver, a separate twistable differential amplifier 600 may be used as a preamplifier with each corresponding sampler that is required for multi-PAM signal reception. Twist voltages may then be applied to the preamplifiers, instead of to the samplers, and the twist voltage may be controlled via linear current steering.

Of course, the twistable differential amplifier 600 is not limited to use in differential multi-PAM signal receivers. For example, the twistable differential amplifier 600 may be used in any circuitry requiring one or more of the following: 1.) sampling at accurately controllable twist voltage values; 2.) consistent twist voltage setting over a broad common mode range; 3.) isolation between adjacent sampling circuits; 4.) substantially constant switching point gain over a large range of twist voltages; 5.) twist voltage offset nulling; and/or 6.) high-frequency gain peaking. For example, the twistable differential amplifier 600 may also be used in receiver circuits employing adaptive equalization, wideband receivers connected to lossy channels, analog-to-digital converter front ends, and high-speed voltage measurement circuits.

Figure 9:
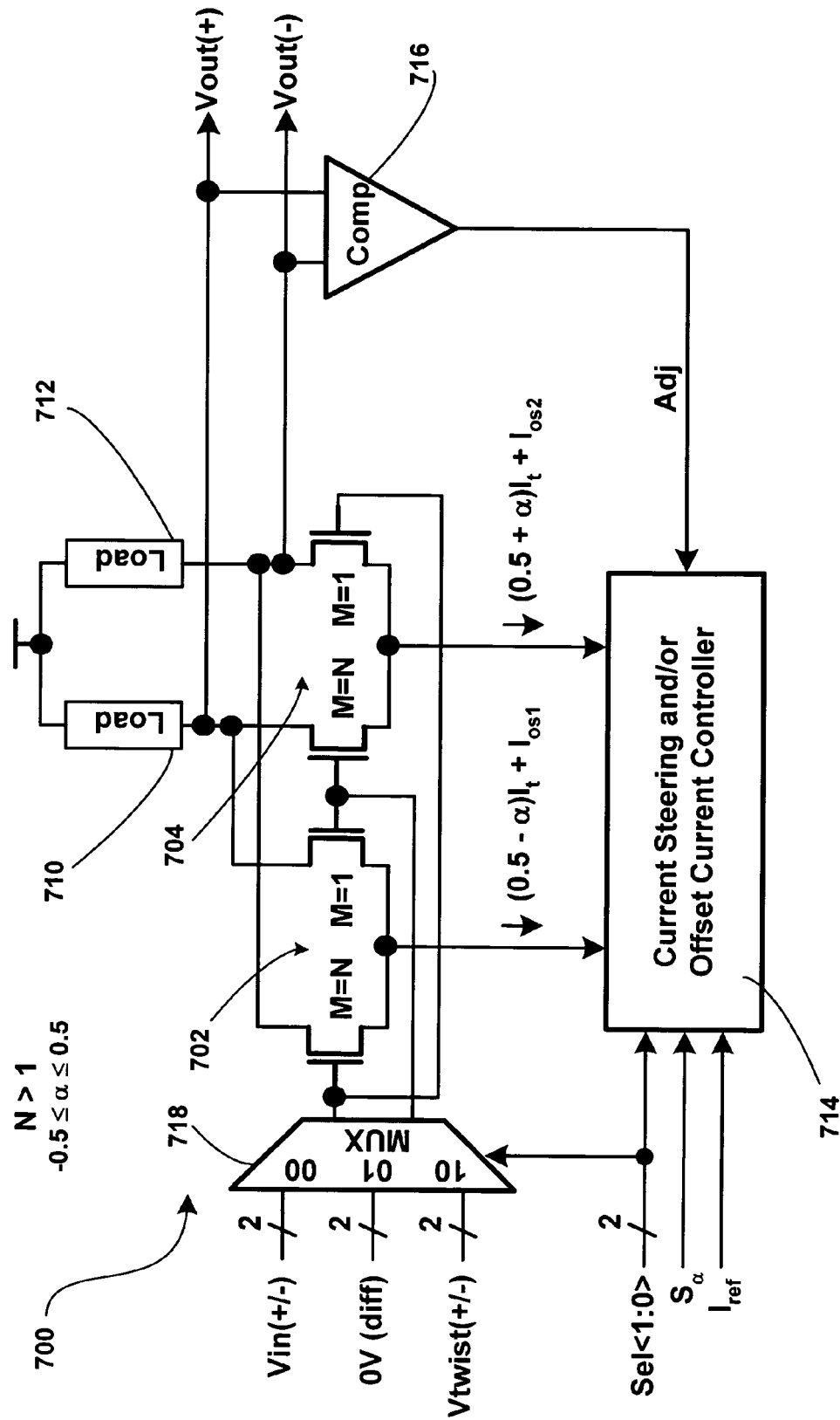
FIG. 9 shows a detailed block diagram of an improved differential amplifier in accordance with an alternate embodiment of the present invention.

Referring to FIG. 9, there is shown a detailed block diagram of a twistable differential amplifier 700 in accordance with an alternate embodiment of the present invention. The twistable differential amplifier 700 comprises a first differential transistor pair 702, a second differential transistor pair 704, a first load 710, and a second load 712, a current steering and/or offset current controller 714, a differential comparator 716, and an optional differential input multiplexer 718, wherein M represents a normalized size of the transistors in the first 702 and second 704 differential transistor pairs, N represents a transistor size ratio variable, and $\alpha$ represents a current steering variable.

As shown in FIG. 9, the differential input multiplexer 718 receives a pair of select signals (Sel<1:0>) for selecting which of three differential input signals (i.e., Vin, Vtwist, or 0V) will be provided to the first 702 and second 704 differential transistor pairs. Alternatively, if the differential input multiplexer 718 is not provided, other means for providing these three differential input signals (i.e., Vin, Vtwist, or 0V) may be provided. For example, a transmitter coupled to the first 702 and second 704 differential transistor pairs may be configured to provide these three differential input signals (i.e., Vin, Vtwist, or 0V), thereby obtaining the benefits of cancellation of mismatches in the transmitter, as well as the receiver and possibly the transmission line.

The differential comparator 716 monitors the differential output voltage (Vout) from the twistable differential amplifier 700 and generates an adjustment signal (Adj) that is used by the current steering and/or offset current controller 714 to control the absolute value of the tail current component ($I_t$) and the value of the offset current components ($I_{os}$). Also, the current steering and/or offset current controller 714 receives a current steering variable signal ($S_\alpha$) for controlling the amount of tail current ($I_t$) that is steered from the first differential transistor pair 702 to the second differential transistor pair 704, or vice versa. Further, the current steering and/or offset current controller 714 receives a current reference signal ($I_{ref}$) to generate a tail current reference signal ($I_{tref}$, see FIG. 10) and an offset current reference signal ($I_{osref}$, see FIG. 10) within the current steering and/or offset current controller 714 to control the absolute value of the tail current component ($I_t$) and the value of the offset current components ($I_{os}$). Additionally, the current steering and/or offset current controller 614 receives the pair of select signals (Sel<1:0>) for controlling the state of the current steering and/or offset current controller 714. That is, the state of the pair of select signals (Sel<1:0>) determines whether the current steering and/or offset current controller 714 is enabled for adjustment of the tail current component ($I_t$) or the offset current components ($I_{os}$), or whether the current steering and/or offset current controller 714 is enabled for normal operation. Of course, during normal operation, the current steering and/or offset current controller 714 may still control the proportion of tail current ($I_t$) that is steered to the first differential transistor pair 702 and to the second differential transistor pair 704 based upon the value of the current steering variable signal ($S_\alpha$).

The twistable differential amplifier 700 allows for the correction of shifted and rotated current steering to twist voltage transfer function curves due to random mismatches in circuit components through two series of steps. In a first series of steps, the current steering to twist voltage transfer function curve is shifted to intersect the origin at $\alpha=0$ by setting the pair of select signals (Sel<1:0>) equal to "01", thereby configuring the differential input multiplexer 718 to select zero volts (i.e., 0V) as the differential input signal (and thereby insuring that differential zero volts (i.e., 0V) is applied to the first 702 and second 704 differential transistor pairs), and enabling adjustment of the offset current components ($I_{os}$) in the current steering and/or offset current controller 714. The effective value of the current steering variable signal ($S_\alpha$) is set to zero (i.e., $\alpha=0$) for 50% current steering. The twistable differential amplifier 700 then operates to adjust the offset current components ($I_{os}$) until the differential output voltage (Vout) is equal to zero.

In a second series of steps, the current steering to twist voltage transfer function curve is rotated by setting the pair of select signals (Sel<1:0>) equal to "10", thereby configuring the differential input multiplexer 718 to select a predetermined (e.g., the maximum differential twist voltage, $Vtwist_{max}$) differential twist voltage as the differential input signal (and thereby insuring that the predetermined (e.g., the maximum differential twist voltage, $Vtwist_{max}$) differential twist voltage is applied to the first 702 and second 704 differential transistor pairs), and enabling adjustment of the tail current component ($I_t$) in the current steering and/or offset current controller 714. The value of the current steering variable signal ($S_\alpha$) is set to a predetermined value (e.g., $\alpha=0.5$), which is desired to correspond to the applied differential twist voltage. The twistable differential amplifier 700 then operates to adjust the tail current component ($I_t$) until the differential output voltage (Vout) is equal to zero.

The first and second series of steps are repeated until the required adjustments are very small. For example, the first and second series of steps may be repeated several times before finalizing the values of $I_{os}$ and $I_t$ in order to average out statistical errors due to noise. From simulation, this typically happens after going through the first and second series of steps once or twice.

After the first and second series of steps have been followed sufficiently so that the required adjustments are very small, the pair of select signals (Sel<1:0>) are set equal to "00", thereby configuring the differential input multiplexer 718 to select the regular differential input voltage (i.e., Vin) as the differential input signal (and thereby insuring that the regular differential twist voltage (i.e., Vin) is applied to the first 702 and second 704 differential transistor pairs), and disabling adjustment of the offset current components ($I_{os}$) and the tail current component ($I_t$) in the current steering and/or offset current controller 714. The value of the current steering variable signal ($S_\alpha$) can now be adjusted to provide current steering corresponding to any value of $\alpha$ between −0.5 and 0.5 to provide the desired twist voltage over the desired twist voltage range (e.g., $+Vtwist_{max}$ to $-Vtwist_{max}$) with substantially only the systematic INL error limiting the accuracy of the twist voltage control transfer function of the twistable differential amplifier 700.

The above-described series of steps may be repeated for all differential amplifiers, having controllable input offset voltages, in a differential multi-PAM signal receiver circuit or other circuitry. Once completed, all the differential amplifiers will have substantially equal current steering to twist voltage transfer function curves. It should be noted, however, that both of the above-described series of steps need not be repeated. For example, only one of the above-described series of steps may need to be repeated, while the other does not. Also, the above-described series of steps may be followed at different times. For example, the above-described series of steps may be followed periodically, or at system start-up only.

Figure 10:
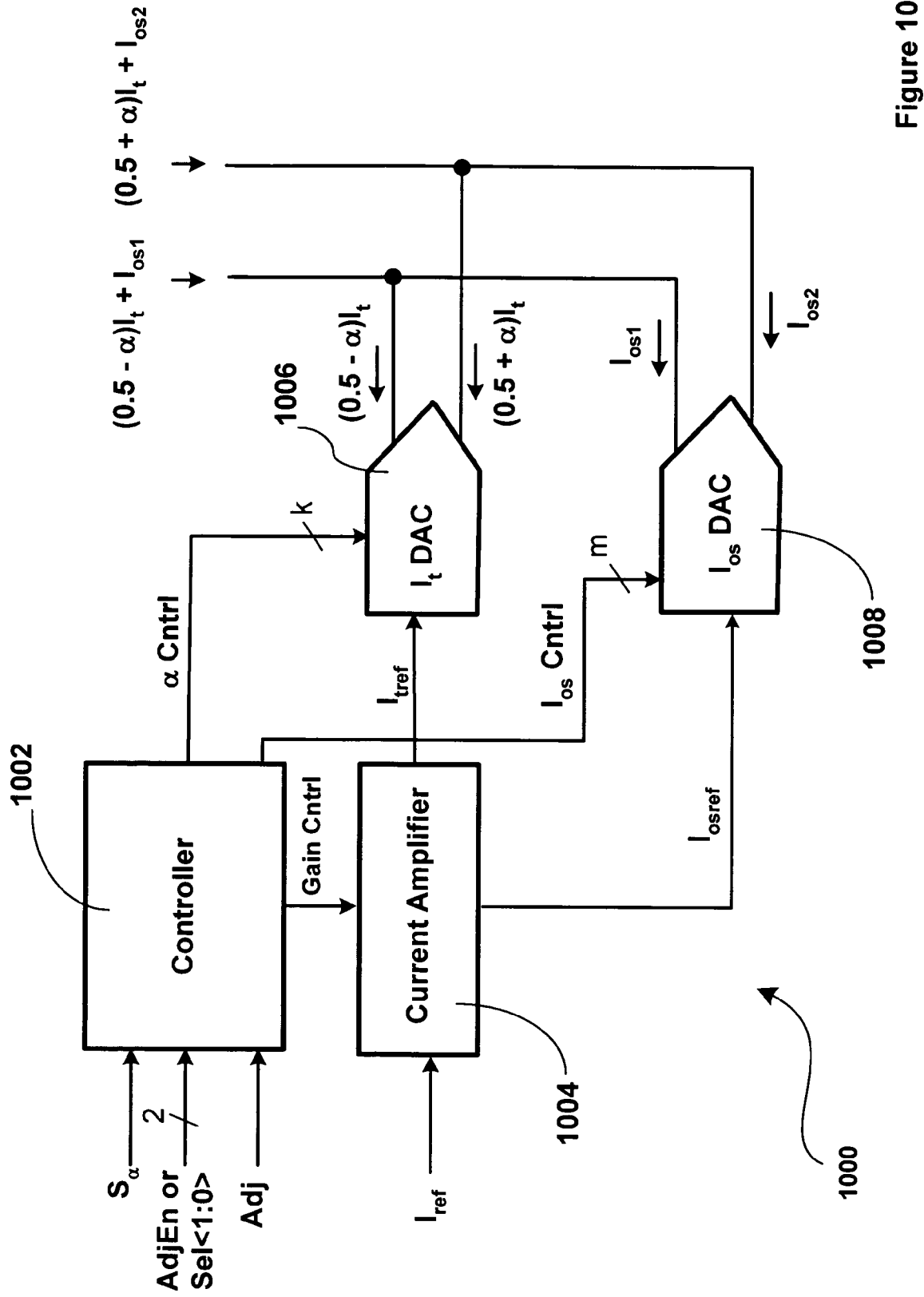
FIG. 10 shows a detailed view of a current steering and/or offset current controller in accordance with an embodiment of the present invention.

Referring to FIG. 10, there is shown a detailed view of a current steering and/or offset current controller 1000 in accordance with an embodiment of the present invention. The current steering and/or offset current controller 1000 comprises a controller 1002, a current amplifier 1004, a tail current ($I_t$) current source 1006, and an offset current ($I_{os}$) current source 1008. The controller 1002 may receive the current steering variable signal ($S_\alpha$), adjustment signal (Adj), and either the adjustment enable signal (AdjEn) from the twistable differential amplifier 600 of FIG. 8 or the pair of select signals (Sel<1:0>) from the twistable differential amplifier 700 of FIG. 9. In either case, the controller 1002 generates an α control signal (α Cntrl), an offset current control signal ($I_{os}$ Cntrl), and a gain control signal (Gain Cntrl). The controller 1002 may be implemented in various forms. For example, the controller 1002 could be a microprocessor, a microcontroller, an application specific integrated circuit (ASIC), or a programmable logic device (PLD).

At this point it should be noted that the current steering variable signal ($S_\alpha$) may be an analog or digital signal. Similarly, the adjustment signal (Adj) may be an analog or digital signal. Also, the adjustment signal (Adj) may represent either just the polarity of the differential output voltage (Vout), or the polarity and magnitude of the differential output voltage (Vout). The α control signal (α Cntrl), the offset current control signal ($I_{os}$ Cntrl), and the gain control signal (Gain Cntrl) may also be analog or digital signals.

The current amplifier 1004 receives the gain control signal (Gain Cntrl) from the controller 1002, as well as the current reference signal ($I_{ref}$). The current amplifier 1004 generates a tail current reference signal ($I_{tref}$) and an offset current reference signal ($I_{osref}$). It should be noted, however, that the offset current reference signal ($I_{osref}$) may be generated elsewhere. That is, it is not required that the offset current reference signal ($I_{osref}$) be generated based upon the current reference signal ($I_{ref}$) and the gain control signal (Gain Cntrl).

The tail current ($I_t$) current source 1006 receives the α control signal (α Cntrl) and the tail current reference signal ($I_{tref}$), and sets a current source level based thereon. Similarly, the offset current ($I_{os}$) current source 1008 receives the offset current control signal ($I_{os}$ Cntrl) and the offset current reference signal ($I_{osref}$), and sets a current source level based thereon. Both the tail current ($I_t$) current source 1006 and the offset current ($I_{os}$) current source 1008 may be implemented in various forms. For example, the tail current ($I_t$) current source 1006 and the offset current ($I_{os}$) current source 1008 could be digital-to-analog converters (DAC), as shown in FIG. 10, or programmable controllers. Furthermore, the tail current ($I_t$) current source 1006 and the offset current ($I_{os}$) current source 1008 could each be implemented as two digital-to-analog converters (DAC), corresponding to the two tail current components (($0.5-\alpha$)$I_t$ and ($0.5+\alpha$)$I_t$) and two offset current components ($I_{os1}$ and $I_{os2}$), respectively, thereby allowing each of the two tail current components (($0.5-\alpha$)$I_t$ and ($0.5+\alpha$)$I_t$) and two offset current components ($I_{os1}$ and $I_{os2}$) to be separately controlled.

At this point it should be noted that correction of shifted and rotated current steering to twist voltage transfer function curves in accordance with the present invention as described above may involve the processing of input data and the generation of output data to some extent. This input data processing and output data generation may be implemented in hardware or software. For example, specific electronic components may be employed in a differential amplifier or similar or related circuitry for implementing the functions associated with correction of shifted and rotated current steering to twist voltage transfer function curves in accordance with the present invention as described above. Alternatively, one or more processors operating in accordance with stored instructions may implement the functions associated with correction of shifted and rotated current steering to twist voltage transfer function curves in accordance with the present invention as described above. If such is the case, it is within the scope of the present invention that such instructions may be stored on one or more processor readable carriers (e.g., a magnetic disk), or transmitted to one or more processors via one or more signals.

The present invention is not to be limited in scope by the specific embodiments described herein. Indeed, other various embodiments of and modifications to the present invention, in addition to those described herein, will be apparent to those of ordinary skill in the art from the foregoing description and accompanying drawings. Thus, such other embodiments and modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breadth and spirit of the present invention as disclosed herein.

The invention claimed is:

1. A circuit comprising:
   a differential amplifier for receiving a differential input signal and generating a differential output signal;
   a comparator for generating an adjustment signal based at least in part upon the differential output signal; and
   a current controller for controlling current steering and at least one offset current in the differential amplifier based at least in part upon the adjustment signal and a current steering variable signal.

2. The circuit of claim 1, wherein the differential amplifier comprises a first differential transistor pair and a second differential transistor pair, and the current controller steers current to at least one of the first and second differential transistor pairs.

3. The circuit of claim 2, wherein the current controller steers current to both the first and second differential transistor pairs.

4. The circuit of claim 2, wherein the current controller controls an amount of offset current in at least one of the first differential transistor pair and the second differential transistor pair.

5. The circuit of claim 1, wherein the differential output signal comprises complementary positive and negative output signal components, and the comparator compares the difference between the positive and negative output signal components.

6. The circuit of claim 1, wherein the differential input signal is a differential multi-PAM input signal.

7. The circuit of claim 1, further comprising:
a differential input multiplexer for selecting between a differential input voltage signal and at least one differential reference signal for the differential input signal.

8. The circuit of claim 7, wherein the at least one differential reference signal comprises at least one of a differential zero voltage reference signal and a differential twist voltage reference signal.

9. The circuit of claim 8, wherein the current controller also receives a select signal for enabling the current controller when the differential input multiplexer selects the differential twist voltage reference signal for the differential input signal.

10. The circuit of claim 8, wherein the current controller also receives a select signal for enabling the current controller when the differential input multiplexer selects the differential zero voltage reference signal for the differential input signal.

11. The circuit of claim 7, wherein control of the at least one offset current is disabled when the differential input multiplexer selects the differential input voltage signal for the differential input signal.

12. The circuit of claim 7, wherein control of a tail current component of the differential amplifier is disabled when the differential input multiplexer selects the differential input voltage signal for the differential input signal.

13. The circuit of claim 7, wherein the differential input voltage signal is a differential multi-PAM input voltage signal.

14. A method for reducing the effect of random mismatches in circuit components in a differential amplifier, the method comprising the steps of:
applying a differential zero voltage reference signal to an input of the differential amplifier;
adjusting at least one offset current component of the differential amplifier until a differential output voltage from an output of the differential amplifier is equal to zero;
applying a differential twist voltage reference signal to the input of the differential amplifier; and
adjusting tail current components of the differential amplifier until a differential output voltage from an output of the differential amplifier is equal to zero.

15. The method of claim 14, further comprising the step of:
setting the value of a current steering variable signal to zero before adjusting the at least one offset current component of the differential amplifier.

16. The method of claim 14, further comprising the step of:
setting the value of a current steering variable signal to a predetermined value before adjusting tail current components of the differential amplifier.

17. The method of claim 14, further comprising the step of:
repeating at least some of the steps recited in claim 14 until the adjustments to the at least one offset current component and the tail current components are not significant.

18. The method of claim 17, further comprising the steps of:
applying a differential input voltage signal to the input of the differential amplifier; and
adjusting current steering in the differential amplifier until a desired twist voltage is achieved.

19. The method of claim 18, wherein the differential input voltage signal is a differential multi-PAM input voltage signal.

20. At least one signal embodied in at least one carrier wave for transmitting a computer program of instructions configured to be readable by at least one processor for instructing the at least one processor to execute a computer process for performing the method as recited in claim 14.

21. At least one processor readable carrier for storing a computer program of instructions configured to be readable by at least one processor for instructing the at least one processor to execute a computer process for performing the method as recited in claim 14.

22. A differential amplifier comprising:
means for applying a differential zero voltage reference signal to an input of the differential amplifier;
means for adjusting at least one offset current component of the differential amplifier until a differential output voltage from an output of the differential amplifier is equal to zero;
means for applying a differential twist voltage reference signal to the input of the differential amplifier; and
means for adjusting tail current components of the differential amplifier until a differential output voltage from an output of the differential amplifier is equal to zero.

* * * * *